United States Patent [19]
Rydel

[11] Patent Number: 5,440,261
[45] Date of Patent: Aug. 8, 1995

[54] ELECTRONIC DEVICE WITH LOW CURRENT CONSUMPTION

[75] Inventor: Charles Rydel, Paris, France

[73] Assignee: Valeo Electronique, Creteil Cedex, France

[21] Appl. No.: 214,791

[22] Filed: Mar. 16, 1994

[30] Foreign Application Priority Data

Mar. 19, 1993 [FR] France .................. 93 03192

[51] Int. Cl.6 ............ H03K 5/08; H03K 19/084
[52] U.S. Cl. .................. 327/333; 327/108; 327/311; 327/319
[58] Field of Search .................. 327/362–363, 327/544, 108, 311, 319, 333

[56] References Cited

U.S. PATENT DOCUMENTS

| | | | |
|---|---|---|---|
| 2,926,307 | 2/1960 | Ehret | 330/18 |
| 2,943,267 | 6/1960 | Randise | 330/18 |
| 4,572,975 | 2/1986 | Bowers | 307/498 |
| 5,132,575 | 7/1992 | Chern | 307/530 |
| 5,159,280 | 10/1992 | Chadwick . | |

FOREIGN PATENT DOCUMENTS 0060164 10/1982 European Pat. Off. ....... H03F 1/02
0549045 6/1993 European Pat. Off. ....... H03F 3/45

OTHER PUBLICATIONS

John Markus "Electronic Circuits Manual", 1971, McGraw Hill, NY, N.Y. (p. 142 the top left figure: Both polarities from one.

Primary Examiner—Margaret Rose Wambach
Attorney, Agent, or Firm—Morgan & Finnegan

[57] ABSTRACT

An electronic device comprises, for example, a portable device or a signal receiver mounted on a vehicle for opening and closing the doors of the vehicle in response to telecontrol signals from a remote source. The device comprises two stages arranged in cascade with respect to the input signal, with the polarising terminals of the two stages being connected in series across the supply.

8 Claims, 2 Drawing Sheets

ELECTRONIC DEVICE WITH LOW CURRENT CONSUMPTION

FIELD OF THE INVENTION

The present invention relates to electronic devices having at least two electronic stages, adapted for reduction in its electrical power consumption.

BACKGROUND OF THE INVENTION

In the prior art, it is known to connect the stages of an electronic device to each other in such a way as to define transfer functions so as to transform an input signal into an output signal which is suitably adapted for the purpose for which the device is designed.

Each stage is connected between a positive d.c. supply line and a negative d.c. supply line, these two lines being common to the various stages of the device.

However, these arrangements in the prior art, when they include a large number of stages, draw a high current from the d.c. supply in order to operate under a given d.c. supply voltage. In particular, this can be a real disadvantage when the electronic device is mounted on a vehicle and draws its supply voltage from a battery, which will become discharged in the course of time.

This is so in the case of portable electronic devices which draw their electrical energy from a source of limited capacity, such as a battery which may be a dry battery or an accumulator, or from photoelectric cells.

This effect is even more of a drawback when the device is arranged to be on continuous alert, as is the case where it consists of a telecontrol receiver, which must be on the alert to receive signals from a remote radio transmitter. In this connection, in such a case at least part of the receiver has to be permanently powered, so that it can detect at any moment the arrival of a control signal.

DISCUSSION OF THE INVENTION

An object of the present invention is to provide a novel means for overcoming the above mentioned drawback of the prior art.

According to the invention, an electronic device of the type comprising at least two stages, each of which has signal input terminals and signal output terminals, together with voltage supply terminals, is characterised in that the supply terminals of the said stages are connected in series between two supply terminals of the device, and in that the signal input and output terminals of the said stages are connected in cascade.

Further features and advantages of the present invention will appear more clearly on a reading of the detailed description of preferred embodiments of the invention which follows, and which is given by way of example only and with reference to the accompanying drawings.

DESCRIPTION OF PREFERRED EMBODIMENTS OF THE INVENTION

Figure 1:
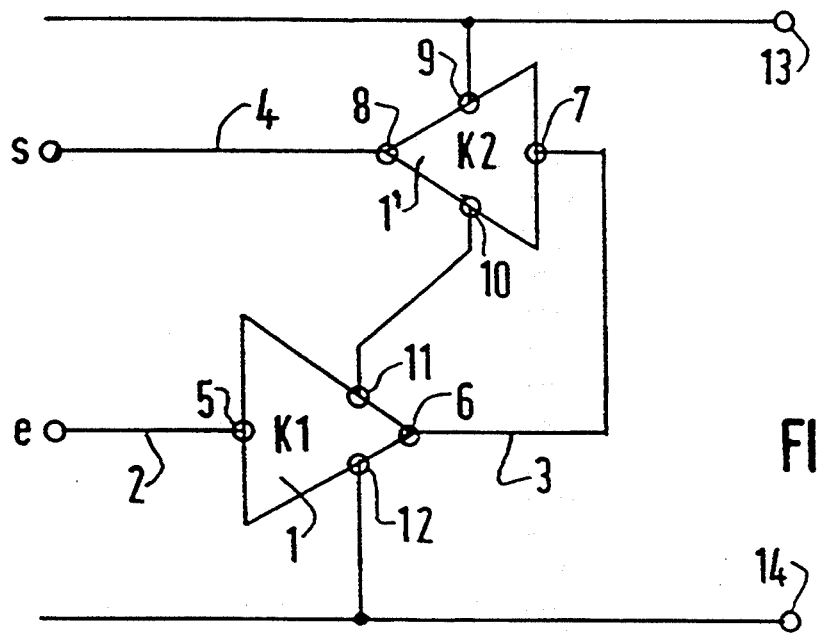
FIG. 1 is a diagram illustrating a first embodiment of a device in accordance with the invention.

FIG. 1 is a diagram showing, in principle, the first embodiment of an electronic device in accordance with the invention. The main elements of this device are a first stage 1 and a second stage 1', each of which has a signal input terminal, 5 and 7 respectively, and a signal output terminal 6 and 8 respectively, together with direct current supply terminals 9 and 11 respectively for high or positive potential, and direct current supply terminals 10 and 12 respectively for low or negative potential.

The signal input terminal of the device itself, indicated by the reference e, is connected through a line 2 to the signal input terminal 5 of the first stage 1. The signal output terminal 6 of the first stage 1 is connected through a line 3 to the signal input terminal 7 of the second stage 1'. The signal output terminal 8 of the second stage 1' is connected through a line 4 to the signal output terminal s of the device itself.

In this arrangement, although the stages 1 and 1' are (from the point of view of the signal received at e) connected in cascade, the stages 1 and 1' are connected in series between a first, high or positive potential, supply terminal 13 of the device and a second, low or negative potential, supply terminal 14 of the device.

With this in view, the second stage 1' is connected through its positive supply terminal 9 to the high or positive potential supply terminal 13 of the device; similarly, the negative, or zero potential, supply terminal 10 of the second stage 1' is connected to the positive supply terminal 11 of the first stage 1. The negative supply terminal 12 of the first stage 1 is connected to the low potential or negative supply terminal 14 of the device itself.

If the equivalent supply resistances, for example in the absence of any signal, in the electronic device shown are respectively R1 between the terminals 11 and 12 for the first stage 1, and R2 between the terminals 9 and 10 for the second stage 1', then if Ua is the direct current supply voltage across the supply terminals 13 and 14 of the device, it will be noted that the power consumed may be expressed as $P = Ua^2/(R1 + R2)$.

In accordance with the teachings of the prior art, it is seen that the positive supply terminals 11 and 9 of the first and second stages 1 and 1' respectively will both be connected to the positive supply 13, while the respective negative supply terminals 12 and 10 of the two stages will be connected in common to the negative supply 14 of the device. In that case, the power consumed will be increased, and can be expressed as $P = Ua^2/R1 + Ua^2/R2$.

In the arrangements according to the present invention described in this specification, the number of stages can be increased, provided that the voltage difference between the terminals which are at the highest d.c. voltage and those at the lowest d.c. voltage is large enough, in respect to each stage, to permit suitable polarisation of the device.

In the device shown in FIG. 1, the output signal produced may be expressed as $S(p) = K1 \times K2\, E(p)$, if K1 and K2 are the respective transfer functions of the stages 1 and 1', and E(p) and S(p) are the Laplace transforms of the input signal e and output signal s of the device as a whole.

The device described herein is applicable in particular when the stages 1 and 1' are either amplifiers or filters, or combinations of these two types of circuit.

Figure 2:
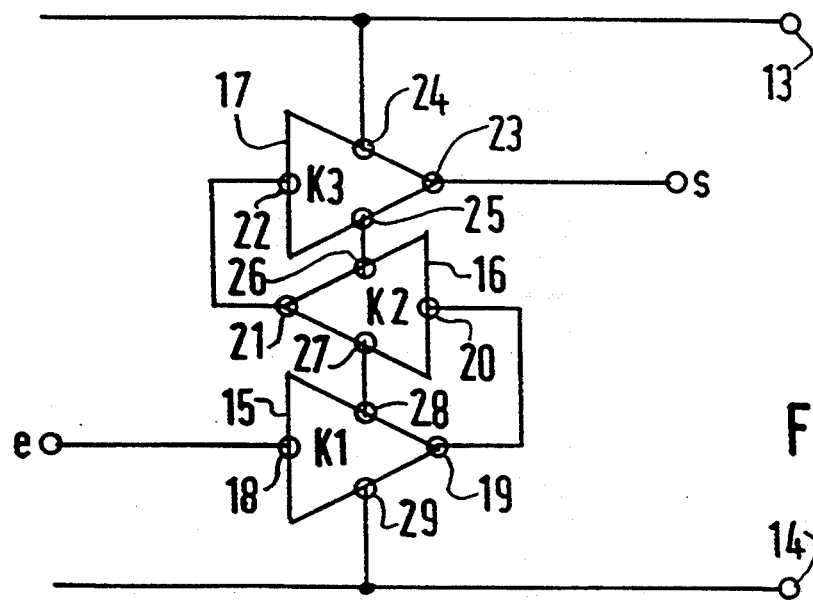
FIG. 2 is another diagram showing a second embodiment of a device according to the invention.

FIG. 2 shows an embodiment in which three stages of the device are connected in cascade as seen from the point of view of the signal received at e. These stages are indicated at 15, 16 and 17 respectively, and are mounted in series between the supply lines 13 and 14. As before, the signal input terminal e of the device is connected through a suitable line to the input terminal 18 of the first stage 15, the output terminal 19 of which is connected to the input terminal 20 of the second stage 16. The output terminal 21 of the second stage 16 is connected to the input terminal 22 of the final stage 17. The output terminal 23 of the latter is connected to the output signal terminal s of the device.

The positive supply terminal 24 of the third stage 17 is connected to the supply terminal 13 of the device as a whole. The negative supply terminal 25 of the third stage 17 is connected to the positive supply terminal 26 of the second stage 16. The negative supply terminal 25 of the second stage 16 is connected to the positive supply terminal 28 of the first stage 15, while the negative supply terminal 29 of the first stage 15 is connected to the negative (or zero) supply terminal 14 of the device as a whole.

The number of stages that can be connected in series in this way, is limited, this limit depending on the minimum value of the polarising voltage that is required by each stage. At the present time, and in particular by making use of components of the MOS type, it is possible to work at d.c. polarising voltages which may be of the order of only three volts, and sometimes less. In addition, by making use of a high d.c. voltage Ua, which may for example be of the order of 24 volts, it is thought possible to connect a large number of devices in cascade in the same way as in the arrangement shown in FIGS. 1 and 2.

Figure 3:
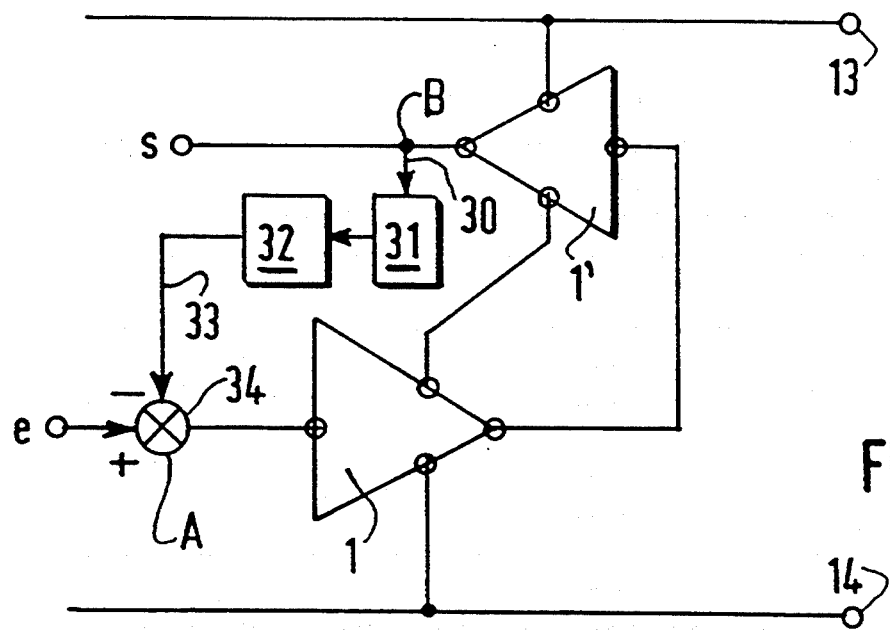
FIG. 3 shows a modification to the embodiment of FIG. 1.

Reference is now made to FIG. 3, which shows a supplementary means which is adapted for use with the device shown in FIG. 1. In this arrangement, the stages 1 and 1' are taken to be voltage amplifiers. They are connected as shown in FIG. 1, and their connection to the d.c. supply will not be described any further. Using the arrangement shown in FIG. 3, it is possible to apply a correction to at least one parameter of the output signal of the device. In particular, and as will be seen more clearly later on herein, it is easily possible with this arrangement to carry out automatic gain correction by detecting, via a connection 30, the output signal s at the output of the second stage 1'.

In FIG. 3, the supplementary means referred to above comprises a detector circuit 31, the output signal from which controls a signal generator 32 of the automatic gain correcting means. The signal generator 32 is connected through a line 33 to an adding element 34 on the signal input path e. The input signal e is for example passed to a positive input terminal (indicated at +) in FIG. 3, of the adder 34, while the output signal from the automatic gain correcting means is connected to a negative input terminal, indicated at "-" in FIG. 2, of the adder 34. In the particular embodiment shown in FIG. 3 (to which further reference will be made below), automatic gain correction works in a negative mode.

In one embodiment, the autoamtic correction is carried out over only part of the pass band of the output signal s. In this embodiment, a pass band filter is employed, this being inserted on the line 30 so as to act as a means which enables the automatic correction to be limited to only part of the output signal. It will be clear that the correction can be applied to only part of the amplitude of the signal, or to any other characteristic of the output signal.

Figure 4:
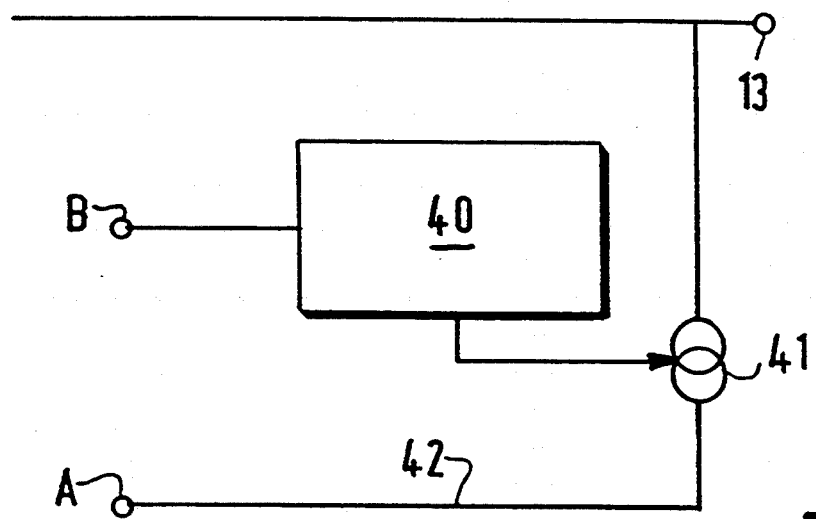
FIG. 4 is a diagram illustrating an automatic means for controlling an electrical parameter for at least one of the stages in the device of FIG. 3.

Reference is now made to FIG. 4, which shows a further circuit for performing automatic correction of an electrical parameter of one of the stages which are connected in cascade in the device. In this connection, it is generally known in the art that an electrical parameter, for example output voltage or gain, or the pass band of an electrical stage comprising a transistor or a device of a similar kind, may be adjusted by modifying the input current. This is especially the case in regard to automatic gain correction. In the circuit shown in FIG. 1, if for example the stages K1 and K2 incorporate amplifying transistors, it is then sufficient merely to reduce the current in the transistor in the stage K1 in order to reduce correspondingly the current in the transistor of the stage K2.

The current variation is obtained by means of a level detecting means 40, which receives the output signal taken from the connecting line 3 in FIG. 1, and which produces a detection output signal 42. This output signal 42 controls a current source 41. The current source 41 is connected between the high potential (or positive) supply line 13 (see FIG. 1) and the summation point A of the currents on the transistor Q1 (not shown). When it is desired to make an automatic gain correction using the circuit of FIG. 4, it is merely necessary to increase, to a greater or lesser extent, the amount of current taken from the supply, and thus to increase the potential Ve. Then, since the voltage Vb remains fixed, collector current is reduced in the transistor Q1 and therefore in the transistor Q2 (also not shown). In this connection, it will be realised that the amplifying stages having the transistors Q1 and Q2 correspond to the stages K1 and K2 in FIG. 1, respectively.

FIG. 4 shows the automatic gain correction described above, as being the correction which is effected in the supplementary means described above with reference to FIG. 3.

The device shown in FIG. 4 includes an automatic gain correction circuit. This comprises a detecting means 40 for detecting the output signal level B of a given stage 1' of the device. It should be noted that the only restriction as to which stage this is, is that the said given stage should not be the input or anterior stage of the device. Its output is connected to the control electrode 42 of a controllable current source 41. Such a controllable current source may easily be constructed using a transistor. Its output is connected to the second input (indicated in FIG. 3 at "-") of the adder 34, which is connected to the input of the first amplifying stage 1 on to which the automatic gain correction is to be applied. According to the way in which the automatic gain correction is programmed, for example in accordance with the pass band, the correcting means reduces the current in this preceding stage 1 by a greater or lesser extent, and consequently reduces the output voltage of the output stage 1' to a greater or lesser extent.

What is claimed is:

1. An electronic device comprising a subsequent output stage for generating a subsequent stage output signal, at least one preceding stage for generating a preceding stage output signal, each stage having a respective signal input terminal, a respective signal output terminal for said individual stage generated signals, and voltage supply terminals, the device further including supply terminals of the device, wherein said voltage supply terminals of said stages are connected in series between said device supply terminals, said signal input and output terminals of at least one of said stages being coupled thereto in cascade.

2. A device according to claim 1, wherein each of said stages comprises a filter.

3. A device according to claim 1, further including means for applying to each of said stages a polarising voltage at least equal to said respective stage minimum polarising voltage.

4. An electronic device for generating a device output signal, the device having an output terminal for the device output signal comprising a subsequent output stage for generating a subsequent stage output signal and at least one preceding stage for generating a preceding stage signal, each stage having a respective signal input terminal, a respective signal output terminal for said individual stage signals, and voltage supply terminals, the device further including supply terminals of the device, wherein said supply terminals of said stages are connected in series between said supply terminals of the device, said signal input and output terminals of at least one of said stages being coupled in cascade, a correcting means for an automatic correction signal path and being connected between the signal output terminal of the device and said input terminal of said subsequent stage, the correcting means having, in succession, a detection circuit, a correcting circuit, and an adder, the adder being connected to said input terminal of said subsequent stage, and said correcting means being connected with said signal output terminal of said preceding stage whereby to take said preceding stage output signal and, in response thereto, to control said correcting circuit so that said correcting circuit transmits a signal to said adder.

5. A device according to claim 4 further comprising a band pass filter coupled in said automatic correction signal path, for applying an automatic correction over only part of the pass band of the output signal of the device.

6. A device according to claim 4, wherein said correcting means further comprise a negative detecting means correction.

7. A device according to claim 4, having an automatic gain correction circuit comprising a level detecting means for input connection to an output of at least one of said device stages, said input receiving the output signal from said stage that said level detecting means is coupled thereto, said level detecting means having an output, a controllable current source having a control electrode connected to the output of said level detecting means, and having an output connected to said adder, the arrangement being such that automatic gain correction reduces the current in said preceding stage and consequently the output voltage level of said subsequent device stage.

8. A device according to claim 1, wherein each of said stages comprises an amplifier.

* * * * *